United States Patent
Kaplan et al.

(10) Patent No.: US 6,932,443 B1
(45) Date of Patent: Aug. 23, 2005

(54) OUTDOOR CABINET FOR ELECTRICAL COMPONENTS

(75) Inventors: Steve Kaplan, Elyria, OH (US); Brian Kennedy, Wellington, OH (US)

(73) Assignee: Multipower, Inc., Elyria, OH (US)

( * ) Notice: Subject to any disclaimer, the term of this patent is extended or adjusted under 35 U.S.C. 154(b) by 319 days.

(21) Appl. No.: 09/973,241

(22) Filed: Oct. 8, 2001

Related U.S. Application Data

(60) Provisional application No. 60/241,618, filed on Oct. 19, 2000.

(51) Int. Cl.$^7$ ............................................. H05K 15/00
(52) U.S. Cl. ................................... 312/213; 312/223.1
(58) Field of Search ............................ 312/213, 223.1, 312/236, 223.6; 361/725, 727; 454/184; 439/90, 100

(56) References Cited

U.S. PATENT DOCUMENTS

| | | | | |
|---|---|---|---|---|
| 853,589 | A | * 5/1907 | Meye | 312/101 |
| 2,439,004 | A | * 4/1948 | Hurley | 38/142 |
| 2,615,775 | A | * 10/1952 | Claybourn et al. | 312/107 |
| 3,101,226 | A | * 8/1963 | Cochran | 312/265.5 |
| 3,192,306 | A | * 6/1965 | Skonnord | 174/16.1 |
| 3,210,456 | A | * 10/1965 | Skubal | 174/16.1 |
| 5,801,331 | A | * 9/1998 | Zachrai | 174/52.1 |
| 5,994,793 | A | 11/1999 | Bobry | |
| 6,019,321 | A | * 2/2000 | Carlson et al. | 248/49 |
| 6,062,665 | A | * 5/2000 | Schneider et al. | 312/265.6 |
| 6,067,223 | A | * 5/2000 | Diebel et al. | 361/676 |
| 6,301,108 | B1 | * 10/2001 | Stockbridge | 361/688 |
| 6,336,691 | B1 | * 1/2002 | Maroney et al. | 312/236 |
| 2003/0011988 | A1 | * 1/2003 | Irmer | 361/690 |
| 2004/0007951 | A1 | * 1/2004 | Holighaus et al. | 312/265.4 |

* cited by examiner

*Primary Examiner*—Janet M. Wilkens
(74) *Attorney, Agent, or Firm*—Renner, Otto, Boisselle & Sklar, LLP

(57) ABSTRACT

A cabinet and associated method are provided for storage of electrical components. In one embodiment, the cabinet includes a chamber including a number of side walls and a top cap and a canted ceiling formed by the top cap. A first overhang portion is defined by a wide end of the top cap and a second overhang portion is defined by a narrow end of the top cap. A number of first air flow openings are located in the first overhang portion and a number of second air flow openings are located in the second overhang portion. The elevation of at least one of the first air flow openings is at least as great as an elevation of the second air flow openings.

19 Claims, 15 Drawing Sheets

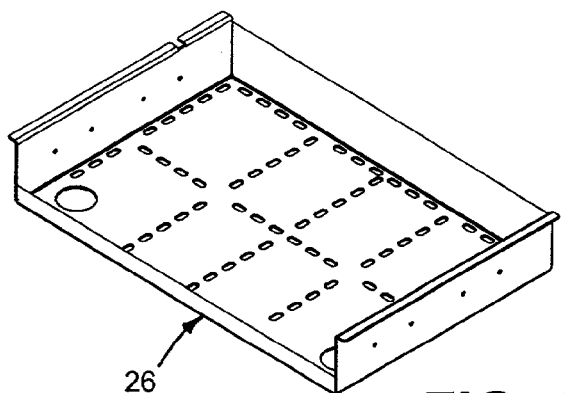
FIG. 19
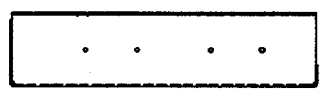 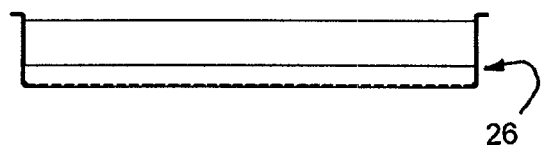
FIG. 20
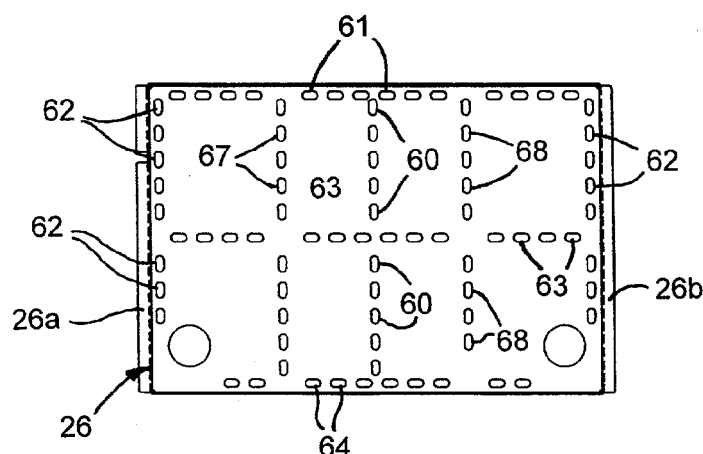
FIG. 21

OUTDOOR CABINET FOR ELECTRICAL COMPONENTS

CROSS REFERENCE TO RELATED APPLICATIONS

This application claims the benefit of U.S. Provisional Patent Application entitled "OUTDOOR CABINET FOR ELECTRICAL COMPONENTS," Ser. No. 60/241,618, filed on Oct. 19, 2000.

TECHNICAL FIELD

The present invention is generally related to the field of cabinets and, more particularly, is related to an outdoor cabinet for electrical components.

BACKGROUND OF THE INVENTION

Currently, large networks are in place that provide communications of all kinds. Some example networks in cable, data communications, telecommunications, and other networks. These networks often employ specialized cabinets to house various electrical components outdoors or in harsh environments. For example, in certain climates, a typical outdoor installation can be subjected to intense sunlight, wind, rain, sleet, snow, dust, as well as tampering on the part of wildlife and insects. However, cabinets that provide adequate protection against outdoor elements often do not provide for efficient heat dissipation without using fans or other air moving components. Unfortunately, such components add cost to such cabinets.

SUMMARY OF THE INVENTION

The present invention provides for a cabinet for storage of electrical components. In one embodiment, the cabinet includes a chamber including a number of side walls and a top cap and a canted ceiling formed by the top cap. A first overhang portion is defined by a wide end of the top cap and a second overhang portion is defined by a narrow end of the top cap. A number of first air flow openings are located in the first overhang portion and a number of second air flow openings are located in the second overhang portion. The elevation of at least one of the first air flow openings is greater than an elevation of the second air flow openings.

In another embodiment, the present invention provides for a cabinet that includes a chamber, at least one battery storage drawer in the chamber with an area defined by the battery storage drawer for placement of at least one battery. A number of air flow openings are located in the area, wherein the air flow openings allow a convection air flow through the at least one battery storage drawer.

In yet another embodiment, the present invention provides for a cabinet that includes a chamber with at least one battery storage drawer in the chamber and a number of batteries positioned on the battery storage drawer, wherein a number of gaps are formed between the batteries. A number of air flow openings are located in the battery storage drawer, the air flow openings being in fluid communication with the gaps formed between the batteries. Also, at least one cable retainer is located in the chamber, the at least one cable retainer holding an excess amount of a cable. Also, a cable splice enclosure and a node are located in the chamber.

In still another embodiment, the present invention provides for a method for storing a number of components. In this regard, the method includes the steps of storing a number of batteries in a battery storage drawer in a storage cabinet, positioning the number of batteries on the battery storage drawer so as to form a number of gaps between the batteries, providing a number of air flow openings in the battery storage drawer that are in fluid communication with the gaps formed between the batteries, mounting an excess amount of cable in the storage cabinet with at least one cable retainer, mounting a cable splice enclosure in the storage cabinet, and mounting node in the storage cabinet.

Other features and advantages of the present invention will become apparent to a person with ordinary skill in the art in view of the following drawings and detailed description. It is intended that all such additional features and advantages be included herein within the scope of the present invention.

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

FIGS. 19–21 are various views of the pull out shelf used in the disclosed embodiment;

DETAILED DESCRIPTION OF THE INVENTION

Figure 1:
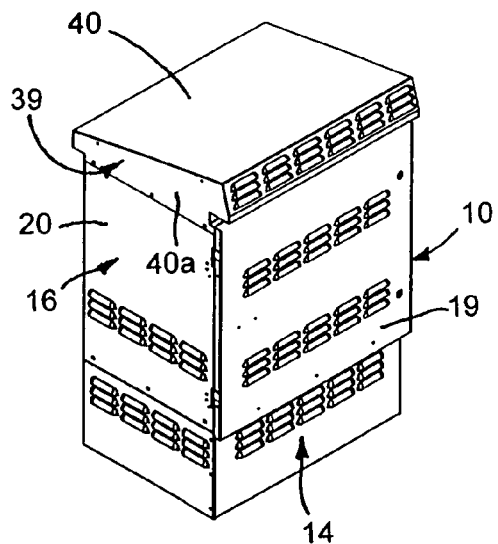
FIG. 1 is a perspective view of a cabinet for housing an UPS converter and control unit and batteries for supplying back-up power.

The present invention relates to a new and improved structure for an outdoor metal cabinet for housing electrical components in which the cabinet is provided with openings, e.g. louvers, in the external walls for venting and changing air inside of the cabinet to dissipate heat generated by at least one operating component therein and/or heat build-up by reason of other factors such as sun loading.

The invention, as illustrated herein, has been incorporated into a cabinet for housing an uninterruptible power supply (UPS) comprising a power converter and control unit for converting voltage from an a. c. power supply, or from a battery power source on failure of the a. c. source. In accordance with the invention the cabinet is of a structure that enables air openings, such as louvers and slots, to be particularly effective in dissipating heat from operation of the converter and control unit as well as from heat build up by reason of sun load, or the like. It will be understood that while the invention has been incorporated into a cabinet for housing a UPS, as will be described, the incorporated features not peculiar to a UPS may be applied to various electrical cabinets to prevent or minimize detrimental heat buildup from either external conditions or heat generation by a component or components within the cabinet, or both.

Electrical cabinets for housing electrical components have been provided with vents and louvers to cool housed electrical components, particularly those whose operation or efficiency are sensitive to heat buildup within the cabinet, either from external conditions and/or heat generation by a component within the housing. The benefits of cooling, either with vents or forced air, or both, can be understood when, for example, it is appreciated that in cabinets housing lead acid batteries of a UPS, each 15 degrees increase over 77 OF in the average operating temperature results in a 50% reduction in the predicted life of the battery. Thus a five year battery in a cool climate will become a 2.5 year battery in a hot climate. "Sun-loading" in hot climates can raise the internal cabinet temperature to 130° F. and above if the internal air is not continuously replaced and turns a 5 year battery into a 5 month battery.

For purposes of this description, the present invention is illustrated as incorporated in an electrical cabinet for housing a converter and control unit as well as the battery pack of an UPS. The UPS may be of the type disclosed in U.S. Pat. No. 5,994,793, issued Nov. 30, 1999, to Howard H. Bobry, and will normally use utility power as the normal power to be supplied and a battery pack for supplying power on the failure of utility power. In the system of that patent, the voltages of the normal power supply may be boosted so that the efficiency of the operation is improved, but heat is still generated and it is desirable to dissipate it as well as any normal heat buildup which would occur under various climatic high temperature conditions to which the operating UPS system may be exposed. Moreover, while heretofore cabinets have been provided with vents and louvers to exchange air between the inside and outside of the cabinet in an effort to maintain dissipate heat, the structure of the cabinets and the location of the vents and louvers have not been such as to enhance and optimize convection air flow. Use of the present invention enables louvers, and air exchange openings such as slots to be used to significantly enhance convection air flow and the cooling of the housed components so that forced air is no longer is needed under various circumstances where it has been necessary to achieve an effective exchange of air to dissipate heat to prevent heat build up. However, even in applications which would still require forced air, the present invention would provide an enhanced volume of convection air flow through the cabinet to minimize the forced air requirements.

Figure 2:
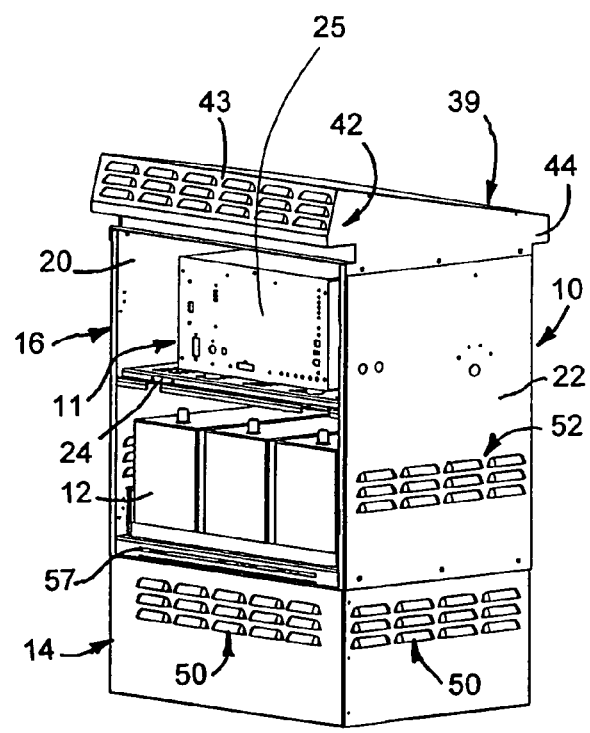
FIG. 2 is a perspective view of the cabinet of FIG. 1 with an UPS housed therein and the front door removed.
Figure 3:
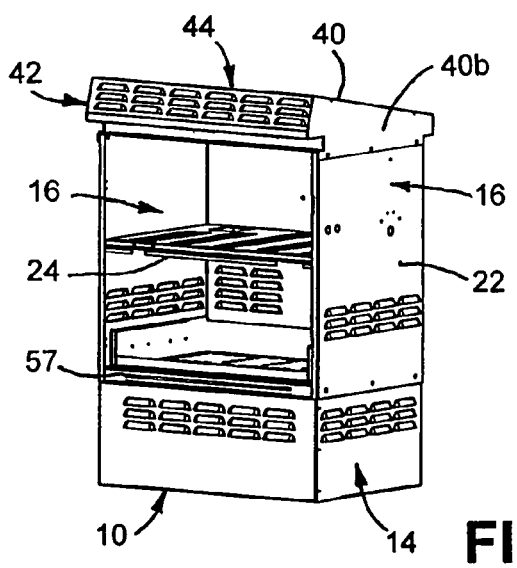
FIG. 3 is a view of the cabinet of FIG. 1 with the door removed.

Referring to FIG. 2 of the drawings, a cabinet 10 provides a housing for a UPS comprising a converter and control unit 11 for effecting the supplying of utility power or power from batteries 12 in the event utility power fails.

Figure 4:
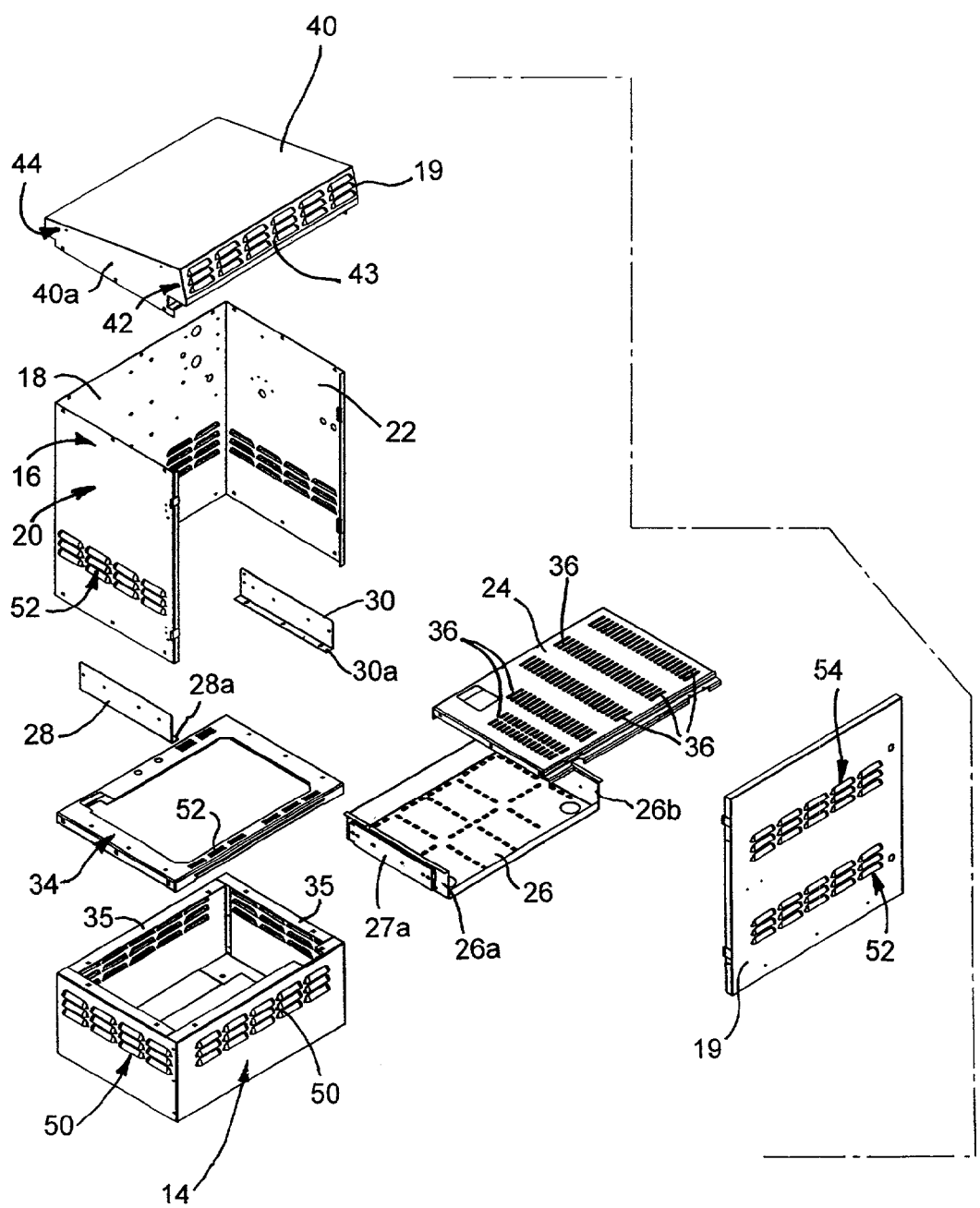
FIG. 4 is an exploded view of the cabinet of FIG. 1.
Figure 6:
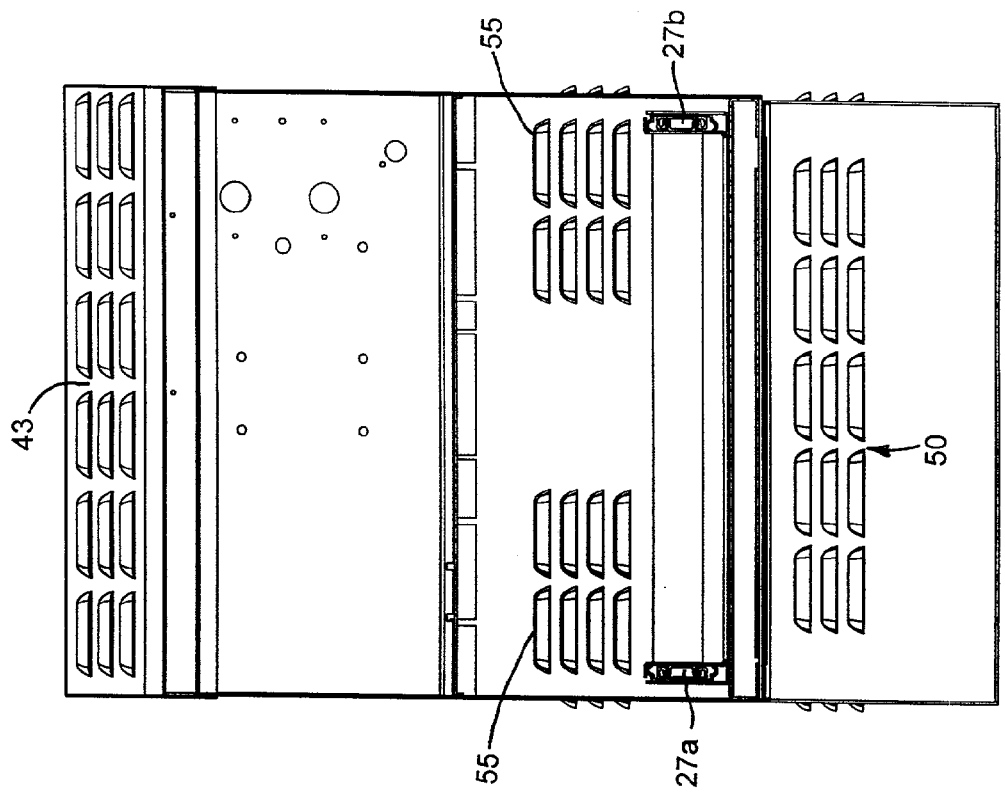
FIG. 6 is a sectional view of the cabinet looking from along line 6—6 of FIG. 5.
Figure 5:
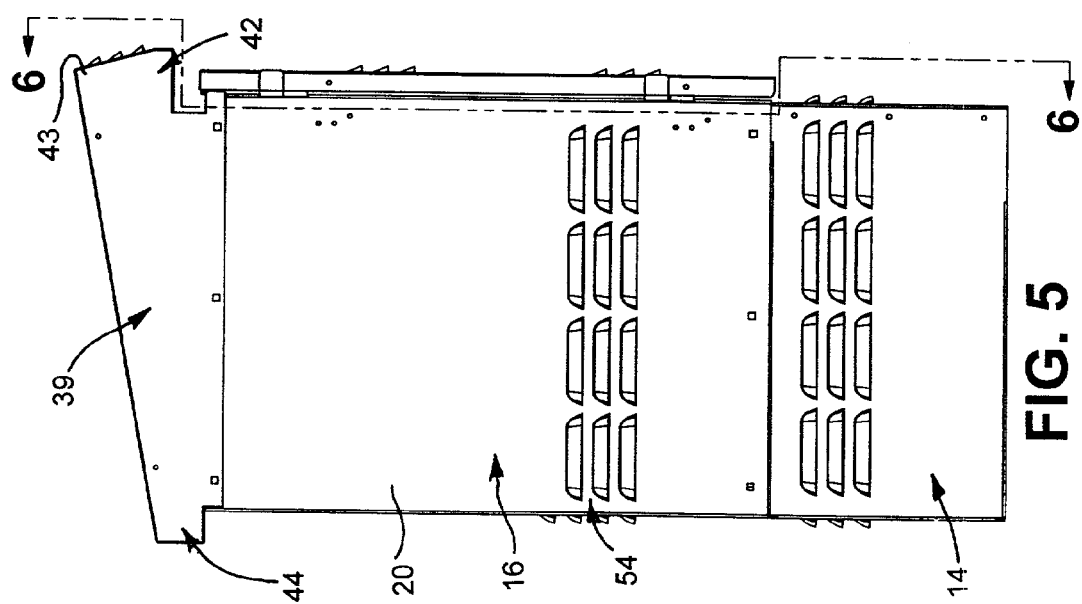
FIG. 5 is a side view of the cabinet of FIG. 1.
Figure 7:
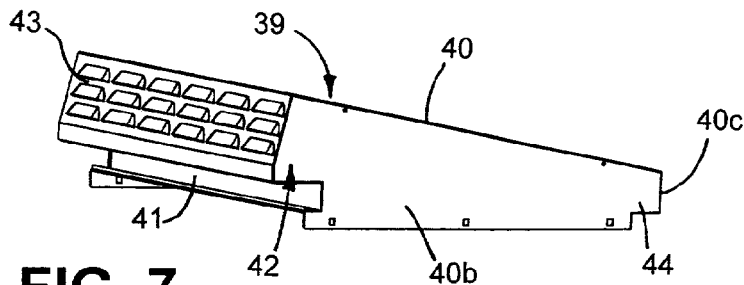
FIG. 7 is a perspective view from the from and right of the detached top cap of the cabinet shown in the drawings.

Referring to FIGS. 1–4, the cabinet 10, comprises a rectangular base 14, having walls defining an open top and bottom (see FIG. 4). A compartment 16 comprises a rear wall 18 (see FIG. 4) and two opposing side walls 20, 22 and essentially forms a rectangular U which sits on and is connected to the base 14. The front side of the compartment 16 comprises a door 19 hinged to the front edge of side wall 20 (see FIGS. 1 and 4) for closing the compartment and providing the front wall of the compartment 16.

The compartment 16 has a top shelf 24 for supporting the UPS converter and a control unit 25 which normally effects the supplying of utility power, but which effects the supplying of power from the batteries 12 stored on a bottom, or second, shelf 26 in the compartment 16, in event the normal power supply fails. The bottom shelf is a pullout shelf and has opposing vertical upstanding flanges 26a, 26b, along the side walls 20, 22 respectively with each being bolted to the sliding arm portion 29 of a respective slide block 27a, 27b, (see FIGS. 4, 5, 6, 12, and 13) each slide block in turn being bolted to a respective one of upstanding flanges 28, 30 which have horizontal flanges 28a, 30 bolted to the upper side of a rectangular frame 34 mounting the compartment 16 on the base 14. The open frame 34 fixes the compartment to the top of the walls of the base 16 and extends around the open bottom of compartment 16. The frame 34 is connected to the base 14 by bolting it to flanges 35 that extend inwardly from the top of the metal walls defining the base 14. The bottom of the base 14 in turn may be secured to the ground using conventional methods for securing such to the ground.

In the compartment 16, the upper shelf 24, has a plurality of front to back rows of parallel short-length slots 36 through the shelf, as is shown in FIG. 4, so as to enable a relatively large volume of air flow upwardly through the top shelf and around an electrical heat generating component, such as the UPS converter and control unit 11, sitting on the shelf. Preferably, the electrical component on the shelf has feet for supporting the component with its bottom raised off the shelf to minimize blockage of air flow and maximize the volume of air which passes through the shelf openings and along the bottom of the component.

With reference to FIGS. 7, 8, 9, 10, and 11, in accordance with the invention, the compartment 16 has a top cap 39 comprising a canted flat metal roof 40 which has depending side portions 40a, 40b connected to the top of the opposing side walls 20, 22 of the compartment. The roof provides a canted ceiling for the compartment which is canted downwardly from a first side of the cabinet, i.e. the front side 19, to its opposing side, i.e. the compartment back wall 18, to guide heated inside air upwardly along the ceiling to a venting space or chamber extending along the front side of the roof top. The top cap 39 has a front overhang portion or chamber 42 as well as a rear overhang portion or chamber 44 which hangs outwardly from the back wall 18 of the compartment 16. The bottom, i.e., underside, of the rear overhang chamber 44 comprises a panel 44a having rows of slots 44b. See FIG. 11.

Figure 8:
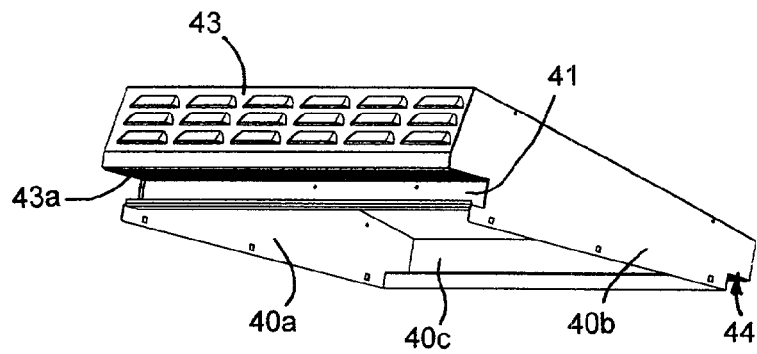
FIG. 8 is an enlarged perspective view of the top cap of FIG. 7 looking up toward the underside from in front to view the front and right side of the top cap.
Figure 9:
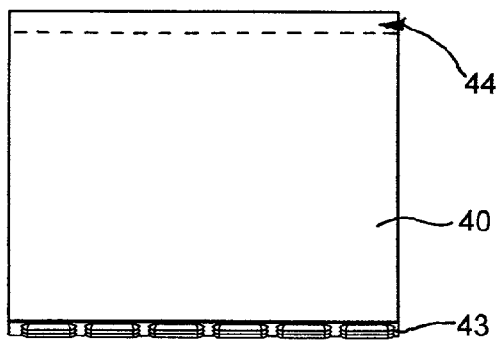
FIG. 9 is a top plan view of the top cap of FIG. 7.
Figure 10:
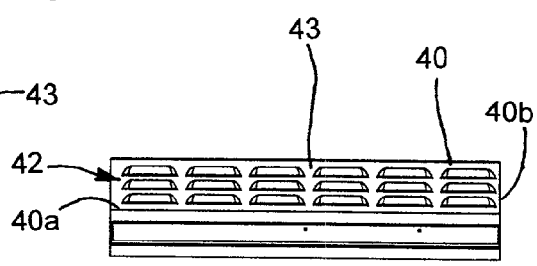
FIG. 10 is a front plan view of the top cap of FIG. 7.
Figure 11:
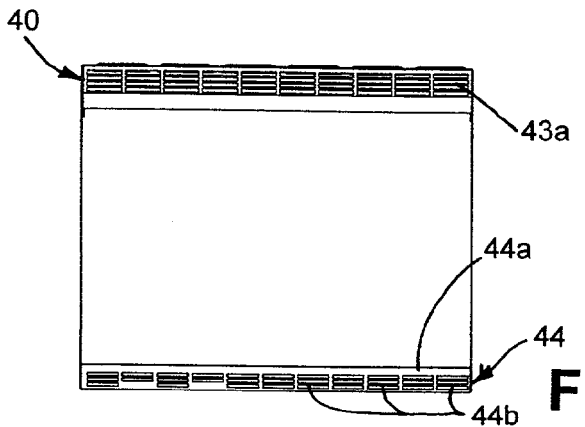
FIG. 11 is a bottom plan view of the top cap of FIG. 7.
Figure 12:
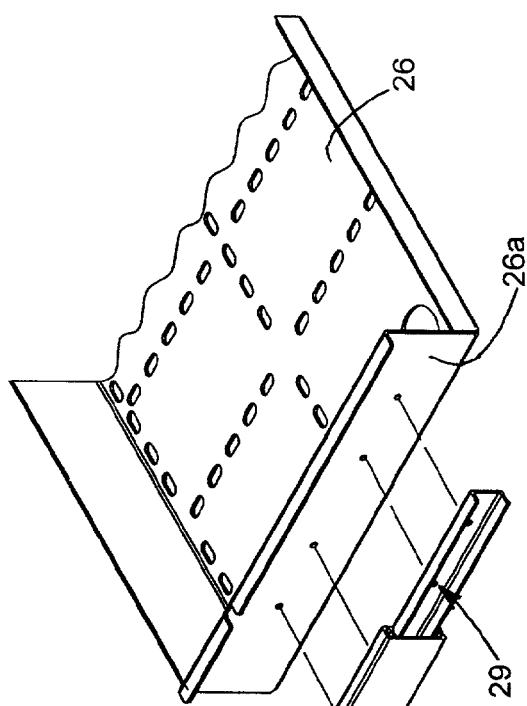
FIG. 12 is a fragmentary exploded view showing the slide block to side block mounting.
Figure 13:
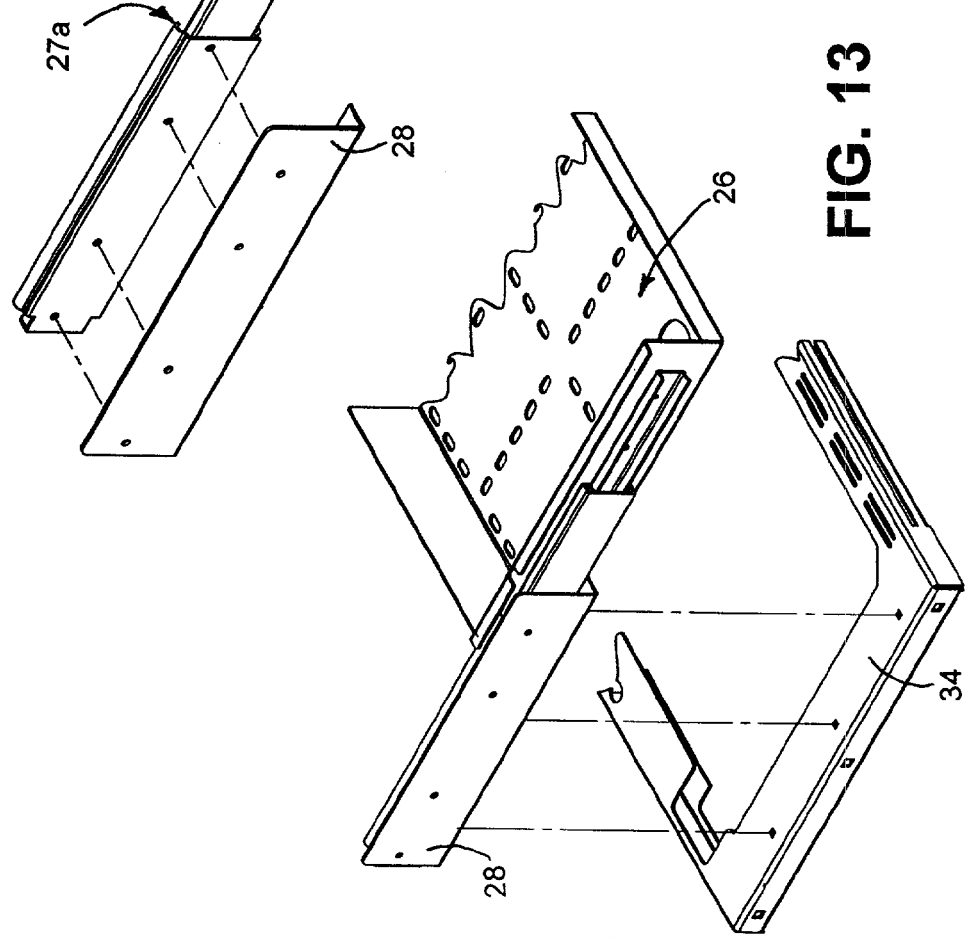
FIG. 13 is an exploded fragmentary view showing the shelf to frame mounting for the pull out shelf of FIG. 4.
Figure 14:
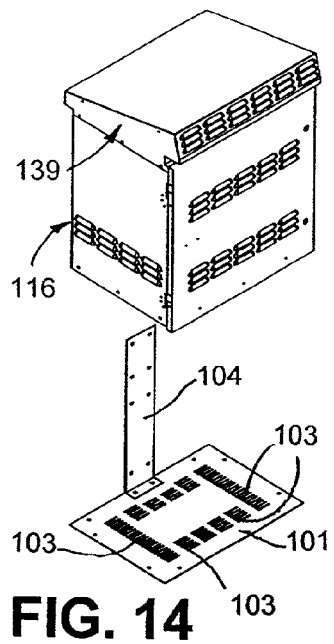
FIG. 14 is an exploded view of a pole mounted cabinet and its bottom frame
Figure 15:
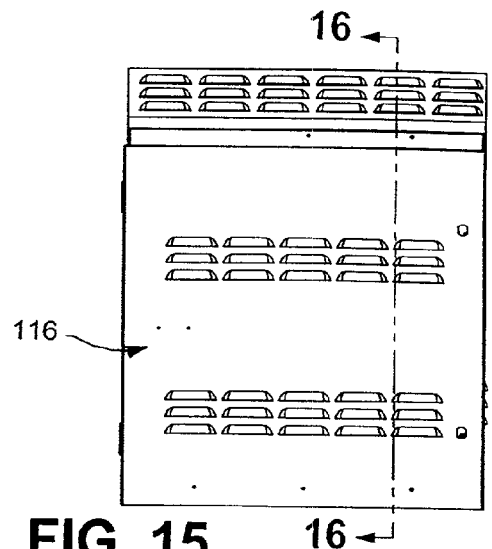
FIG. 15 is an enlarged front view of the cabinet of FIG. 14.
Figure 17:
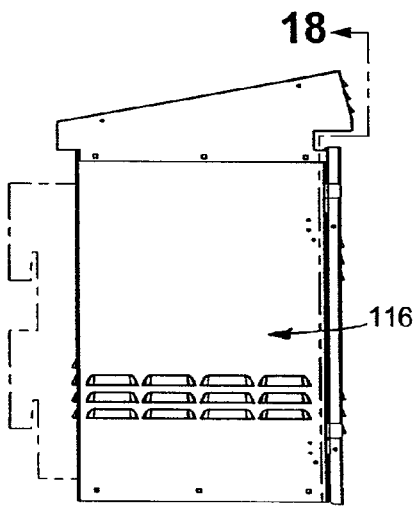
FIG. 17 is a left side view of the cabinet shown in FIG. 15.
Figure 16:
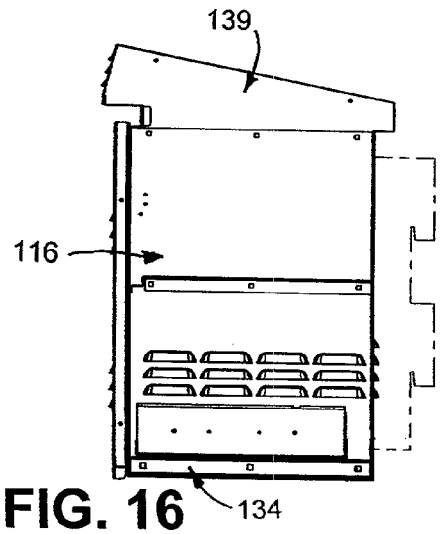
FIG. 16 is a cross sectional view taken along line 16—16 in FIG. 15 looking in the direction of the arrows.
Figure 18:
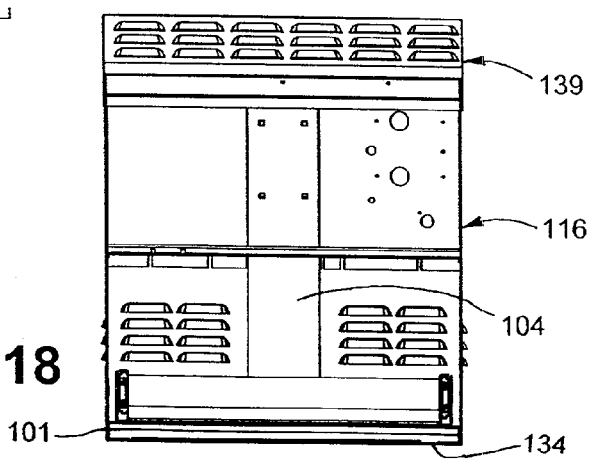
FIG. 18 is a sectional view taken along line 18—18 in FIG. 17 looking in the direction of the arrows.

The overhanging front portion 42 of the top cap has a front face comprising a vertical but inwardly sloping louvered panel 43, and a slotted panel 43a (see FIG. 9) which forms the bottom, i.e., underside, of the front overhang chamber and which extends inwardly from the front of the overhang to the top of a vertical wall portion 41 at the inner end of the overhang (See FIG. 8). The vertical wall portion 41 is fixed between the tops of the side walls 20, 22.

The louvers and slot openings of the overhanging structures, along with other slot openings and louvers and the open bottom of the compartment and the louvered base, provide a flow of cooling air from the bottom of the cabinet upwardly to the heat collecting and venting space to establish an upward flowing convection system for the inside of the cabinet and the electrical components therein. To promote air flow, the base is provided with a row 50 comprised of multiple stacks of three high louvers in each of the four sides of the base. In addition to these, a respective row comprising rows of three high louvers 52 form air passageways in each of the metal sides 20, 22, and the door 19, with the rows extending for essentially the width of the sides and door at locations immediately above the pull out shelf. Moreover, an additional row of three high louvers 54 may be provided in the door 19, and, preferably, the compartment has slots in the top and bottom shelves to allow upward air flow through the compartment 16. Moreover, the rear wall of the cabinet has, in the illustrated embodiment, four vertical rows of louvers 55, spaced from each other immediately above the pull out shelf, for further feeding the upward air flow.

As described above, the frame 34 mounts the compartment 16 onto the base 14. For aiding the upward convection flow, the top side of the front side of the frame has a line of openings 57, along the front edge of the shelf 26, which open into the compartment and which communicate with a slot in the front edge of the frame. The slot in turn is open to external air entering the slot from the bottom of the door which does not fit tightly against the frame along its bottom portion.

It has been found that while various openings may be provided to enhance air flow, the use of a top cap with a canted roof connecting two opposite sides with one side being higher than its opposing side and having a venting overhang along the high side of the cap with the over hang being higher that a second overhang along the low side of the roof, each of said overhangs having air flow openings in the form of louvers or slot passages for enhancing the flow of air. The higher overhang 42 has a larger air handling capacity than the lower overhang since the lower overhang only has a horizontal panel with air holes or slots while the front overhang has a horizontal panel with slots as well as the louvered panel 43 for establishing the convection flow. It also has been found that to establish a significantly enhanced flow, the roof should have enough slope that the slots of the low overhang panel are lower than, preferably below, the louvers and slots of the high overhang panels. While various venting arrangements have been used in cooling electrical cabinets, it has been difficult to get a sufficient convection air flow to effect good convection cooling in the cabinet. The use of the canted top and overhangs of the present invention makes it possible to effect a significant improvement in the cooling of electrical cabinets by convection air flows. The particular high-low arrangement of the overhanging chambers appears to be the key to and enables the louvered openings or slots in the walls of the cabinet and the shelves to effect an enhanced and optimized convection air flow. It appears that the lower overhang works in this arrangement to provide a flow of air into the cabinet which is needed to optimize and significantly increase the convection flow upwardly through the cabinet.

It will be understood that for a UPS, the depth and width of the cabinet and the shelves therein may be varied to accommodate a different number of batteries. If the UPS is to be of a three battery configuration, a shelf for storing three batteries side by side (length of batteries extending front to back) can be made somewhat longer between the walls 20,22 to accommodate four batteries arranged lengthwise along the shelf in two side-by-side rows between the sides 20, 22. When two batteries are to be arranged end to end along the length of the shelf, the lengthwise dimension of the shelf can be made sufficient to allow spacing between the inner ends of the batteries for air from openings 60 located front to back across the middle of the shelf, as well as allowing air to flow through openings 61 along the rear side of the shelf 26 and openings 62 along the side flanges 26a, 26b. Moreover, the depth of the shelf and the lengthwise centerline of the shelf is such as to allow air to flow, from the shelf openings 63 along the lengthwise center line of the shelf, into space between sets of two batteries arranged lengthwise on the shelf. Further, the shelf 26 may also be provided with air openings 64.

The shelf 26 as described will also accommodate three batteries set side by side on the shelf 26 as shown in FIG. 2. However, the center battery will cover the middle cross-shelf row of openings 60 for passage of cooling air. Accordingly, a cross shelf row of openings 67 is provided which is generally I/3 of the shelf length from the shelf flange 26a. Similarly, an across shelf row of openings 68 is located essentially I/3 of the shelf length from the flange 26b. So that three batteries may be placed within spaces defined by the cross-shelf rows of openings 67, 68 with the air openings allowing convection air flow between adjacent sides of the batteries as well as around the periphery of the shelf (See FIGS. 19, 20, and 21).

In accordance with the present invention, the structure of a cabinet is such that the presence of heat generated, or heat such as sun load, which would build up to establish a high temperature in the cabinet, will cause a convection air flow for essentially the full vertical height of a cabinet to prevent heat build up in the cabinet. The upward convection air flow carries the heat to the heat collecting and venting location at the top of the cabinet. Preferably any heat generating component, such as a UPS, is located on the top shelf with other components which are affected by high temperatures but not in and of themselves generating significant heat are located on a lower shelf.

In the embodiments illustrated in the drawings, the cabinet has an upper and a lower shelf for supporting electrical components. When housing a UPS system having a converter and control component which generates heat, the UPS is preferably located on the upper shelf where the shelf openings constitute a relatively high percentage of shelf area, and the back-up batteries on a lower shelf. The shelves are provided with openings for passage of electrical connections between the battery pack and the UPS converter and control component and the cabinet walls have conventional knockouts for selectively making various external connections to the interior of the cabinet. Moreover, the pullout second shelf in the embodiment is not as deep as the cabinet to provide additional room for various connecting cables behind the shelf.

Also, the shelf 26 has round cable openings at each front corner of the shelf and the frame 34 has a notch at a rear corner for passing cable and air into the compartment 16.

While the compartment 16 has been described as part of a ground cabinet, it is to be understood that it may be used as pole mounted cabinet. For a pole mounted cabinet, a compartment 116 with its roof cap 139 and a frame 134 corresponding to the compartment 16, roof cap 39 and frame 34, are used without a base, such as the base 18. Instead, the top of the frame 134 is closed over with a plate 101 having air openings 103 there through. A reinforcing strap 104 has a bottom angle 105 which is connected to the top of the frame 134 and the strap is secured inside the cabinet to the rear wall of the cabinet. With these changes the cabinet of FIGS. 1–4 becomes a cabinet for pole mounting with the use of conventional pole hangers indicated by phantom lines in FIGS. 14, 15, 16, 17, and 18.

Figure 22:
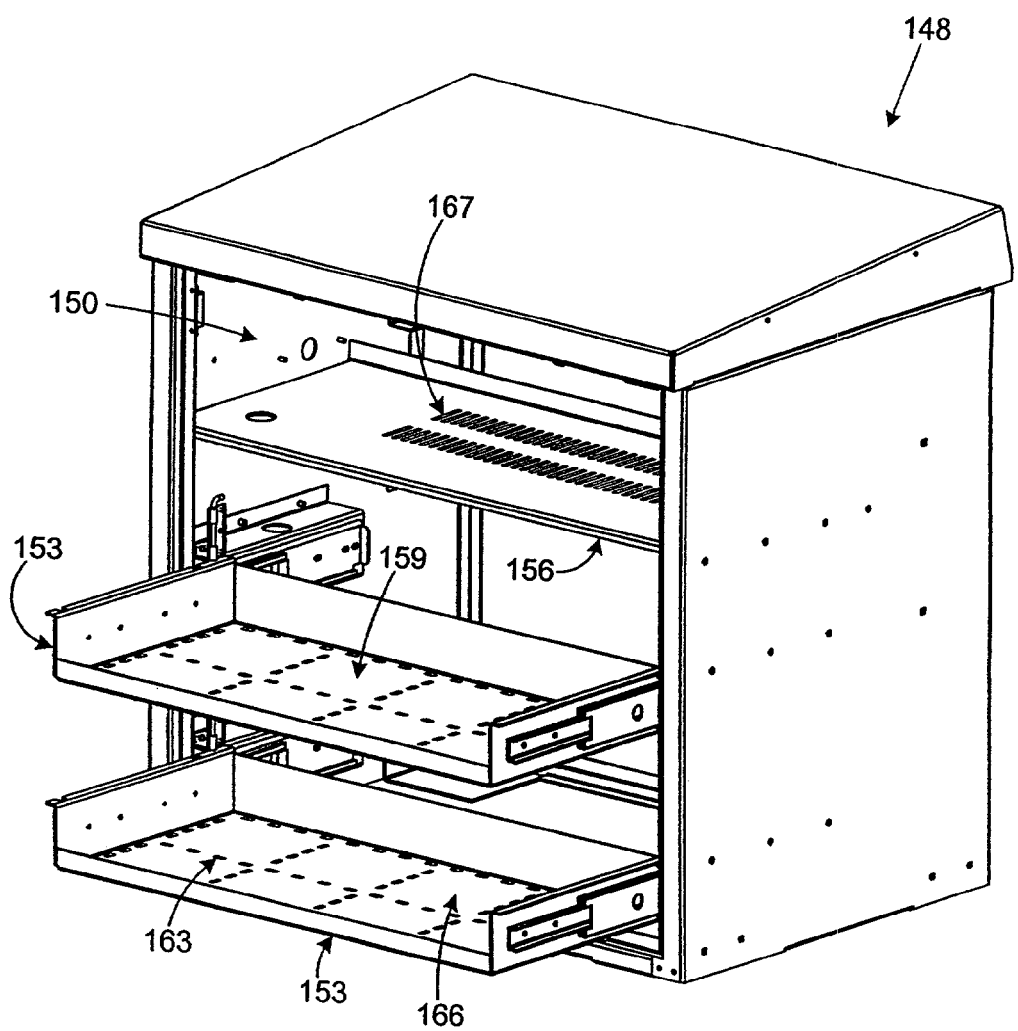
FIG. 22 is a frontal perspective view of a cabinet according to another embodiment of the present invention.

With reference to FIG. 22, shown is the cabinet 148 according to another embodiment of the present invention. The cabinet 148 forms a chamber 150 that includes battery storage drawers 153 that are in an extended position and a top shelf 156. The inside of the cabinet 148 is visible due to the removal of a front side wall (not shown). Each of the battery storage drawers 153 includes an area 159 onto which batteries (not shown) are placed with a number of air flow openings 163. The air flow openings allow a convection air flow through the battery storage drawers 153. Specifically, air that is heated by the electrical operation of the batteries placed in the battery storage drawers 153 is allowed to rise upwards through the battery storage drawers 153 due to the air flow openings 163. Due to the fact that air can flow through the air flow openings 163, the cabinet 148 allows for greater heat dissipation as will be discussed. In addition, the top shelf 156 includes slots 164 that allow air to flow therethrough.

The air flow openings 163 are positioned to define a number of battery positions 166 in the area 159. In particular, a number of batteries may be placed on the battery storage drawer 153 in any one of a number of configurations based upon the placement of the air flow openings 163. That is to say, that the batteries may be placed in different orientations and in different patterns on the battery storage drawers 153 depending upon the particular pattern of the air flow openings 163 that create the battery positions 166. In other words, the air flow openings 163 outline the periphery of the battery positions 166, thereby defining the air flow openings 163. Various battery positions 166 may overlap to facilitate multiple battery configurations. For some configurations then, one or more batteries may lie on top of various air flow openings 163 that define battery positions 166 for a different configuration, etc.

Figure 23:
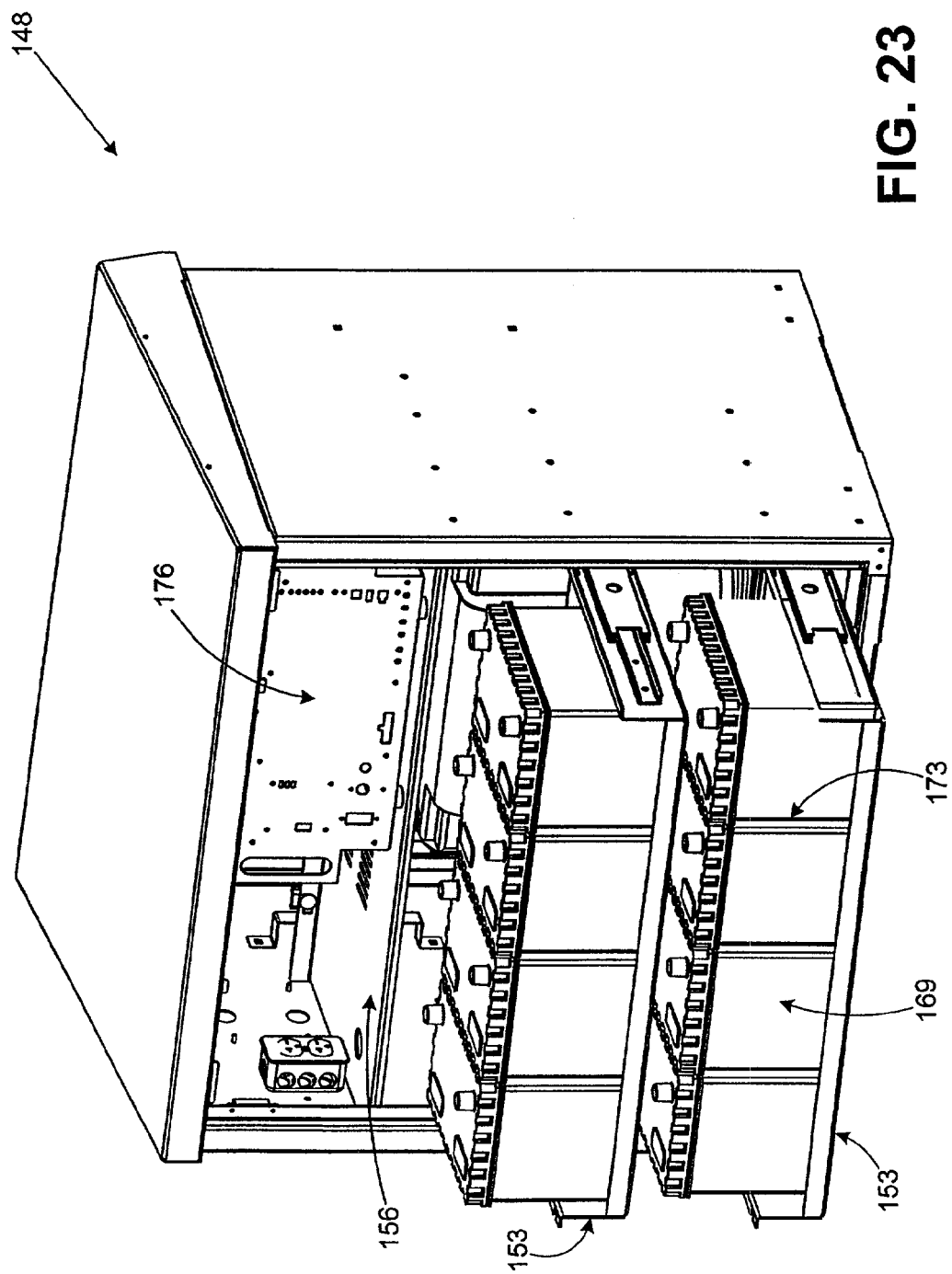
FIG. 23 is a second frontal perspective view of the cabinet of FIG. 22 with batteries placed in battery trays.

With reference to FIG. 23, shown is the cabinet 148 with a number of batteries 169 placed thereon. The batteries 169 are placed on the battery storage drawers 153 so as to create gaps 173 between adjacent ones of the batteries 169. The gaps 173 preferably coincide with the air flow openings 163 (FIG. 22). In this manner, the air flow openings 163 are in fluid communication with the gaps 173 formed between the batteries 169. In addition, an uninterruptible power supply 176 is placed on the top shelf 156. The batteries 169 thus supply backup power to the uninterruptible power supply 176 as can be appreciated by those with ordinary skill in the art. It is understood, however, that electronic devices other than the uninterruptible power supply 176 may be housed in cabinet 148.

Figure 24:
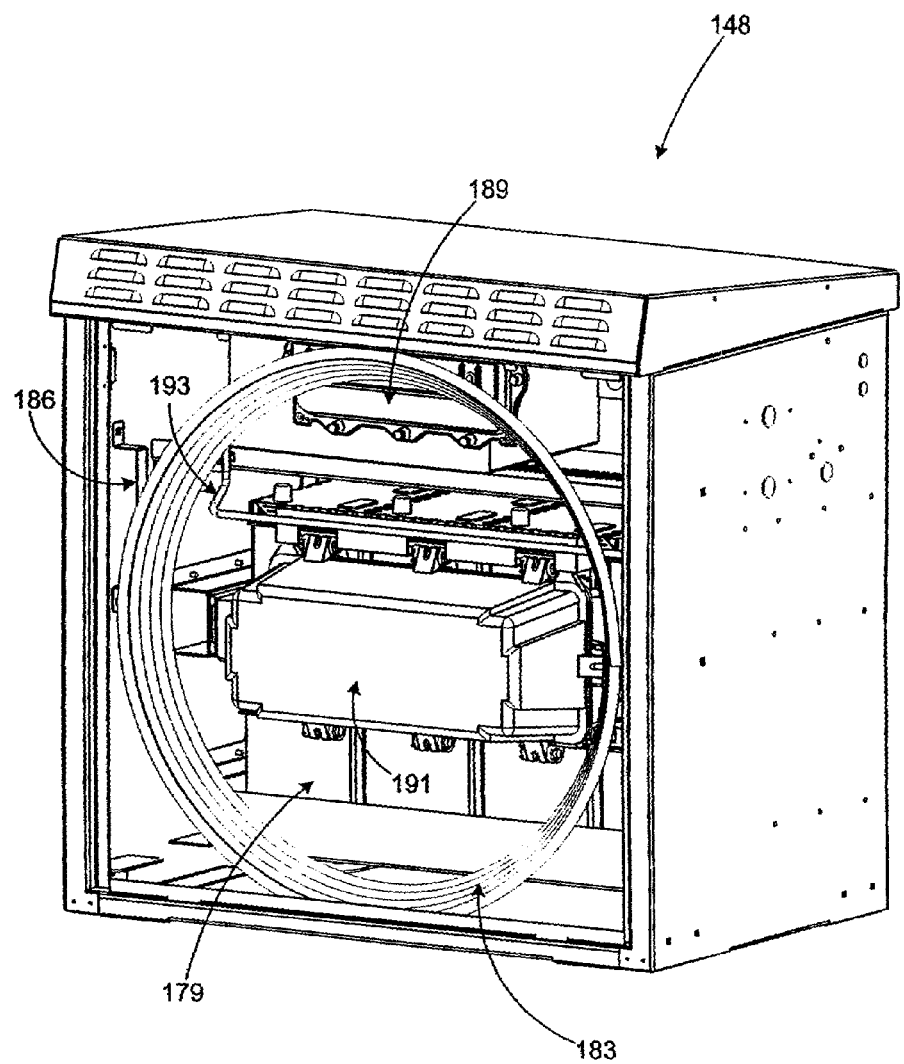
FIG. 24 is a rear perspective view of the cabinet of FIG. 22 showing a number of components mounted in a cable storage compartment of the cabinet.

Turning then to FIG. 24, shown is a rear view of the cabinet 148 with a rear side wall removed to expose a cable storage compartment 179. The cable storage compartment 179 includes an excess amount of cable 183 that is held to one or more cable retainers 186 with VELCRO fasteners strips, twist ties, or other retaining device that will hold the excess amount of cable 183 within the cable storage compartment 179 as can be appreciated by those with ordinary skill in the art. A cable splice enclosure 189 is mounted to the upper bracket (not shown) and is also stored in the cable storage compartment 179. In addition, a node 191 is stored in the cable storage compartment 179 and is mounted on the lower bracket 193. The cable storage compartment 179 thus provides for the storage of the cable splice enclosure 189, the node 191, and the excess amount of cable 183 thereby providing for a junction in an optical fiber network, as can be appreciated by those with ordinary skill in the art. The specific function of the cable splice enclosure 189 and the node 191 are generally known by those with ordinary skill in the art and are not discussed herein in detail.

Figure 25:
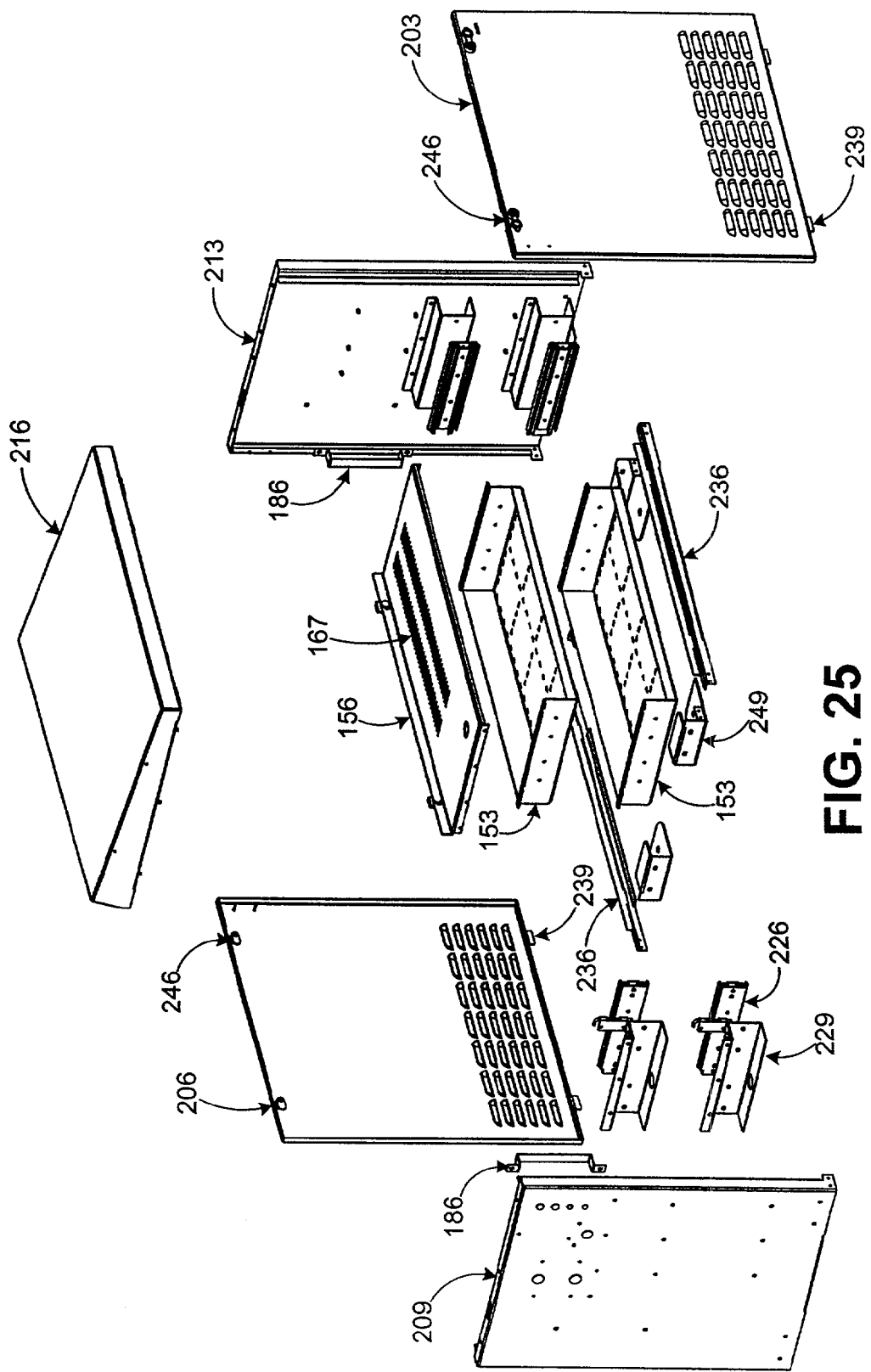
FIG. 25 is a front exploded view of a cabinet of FIG. 22.

With reference to FIG. 25, shown is an exploded view of a cabinet 148 according to another embodiment of the present invention. The cabinet 148 includes a front side wall 203, a rear side wall 206, a left side wall 209, and a right side wall 213. The cabinet also includes a top cap 216. The front side wall 203, rear side wall 206, left side wall 209, and right side wall 213 and the top cap 216 are attached to each other to form the chamber 150 (FIG. 22). In this regard, the above components may be attached to each other using one of a number of approaches. For example, fasteners may be employed, such as screws, bolts, rivets, and other fasteners. Also, adhesives, welding, and other means of fastening the various components to each other may be employed as can be appreciated by those with ordinary skill in the art. In addition, appropriate weather sealing materials may be employed to line or otherwise weatherproof the various junctions between above-mentioned components to ensure that the resulting cabinet 148 is weather proof when assembled.

The cabinet 148 includes battery storage drawers 153 and a top shelf 156. The battery storage drawers 153 are attached to the left and right side walls 209 and 213 using slide blocks 226 that enable the battery drawers 153 to be pushed in and out of the cabinet 148. The slide blocks 226 are attached to slide mount brackets 229 that are in turn attached to the left and right side walls 209 and 213. The slide blocks 226 may be attached to the slide mount brackets 229, and the slide mount brackets may in turn be attached to the left and right side walls 209 and 213 using screws, bolts, rivets, welding, adhesives, and other fasteners or means of attachment as can be appreciated by those with ordinary skill in the art.

Attached to the top shelf 156 is the bracket 193 that is employed to hold various components within the cabinet 148 as was described. The cabinet 148 also includes bottom frame pieces 236 that are attached to the left and right side walls 209 and 213. In addition, the top cap 216 is also attached to the left and right side walls 209 and 213. The bottom frame pieces 236 and the top cap 216 provide for the removable attachment of the front and rear side walls 203 and 206. Specifically, the front side wall 203 and the rear side wall 206 include tabs 239 that are placed in tab receptacles 243 in the bottom frame pieces 236. The front and rear side walls 203 and 206 include clasps 246 that engage the top cap 216. In this manner, the front and rear side walls 203 and 206 are attached to the cabinet 148 in a manner that provides for easy removal to allow maintenance access to the components within the cabinet 148.

The cabinet 148 also includes cabinet feet 249 that are attached to the bottom corners of the cabinet 148 and provide a means by which the cabinet 148 may be adhered to a base structure as will be described. The cabinet 148 also includes cable retainers 186 that are employed to hold excess cable as will be described.

Note that the top cap 216 may include a false top surface that is exposed to an environment surrounding the cabinet 148. Such a false top surface would act as a heat shield to absorb radiant heat from sunlight before it falls upon the top cap 216, etc. Such a heat shield may be employed with other portions of the cabinet 148.

Figure 26:
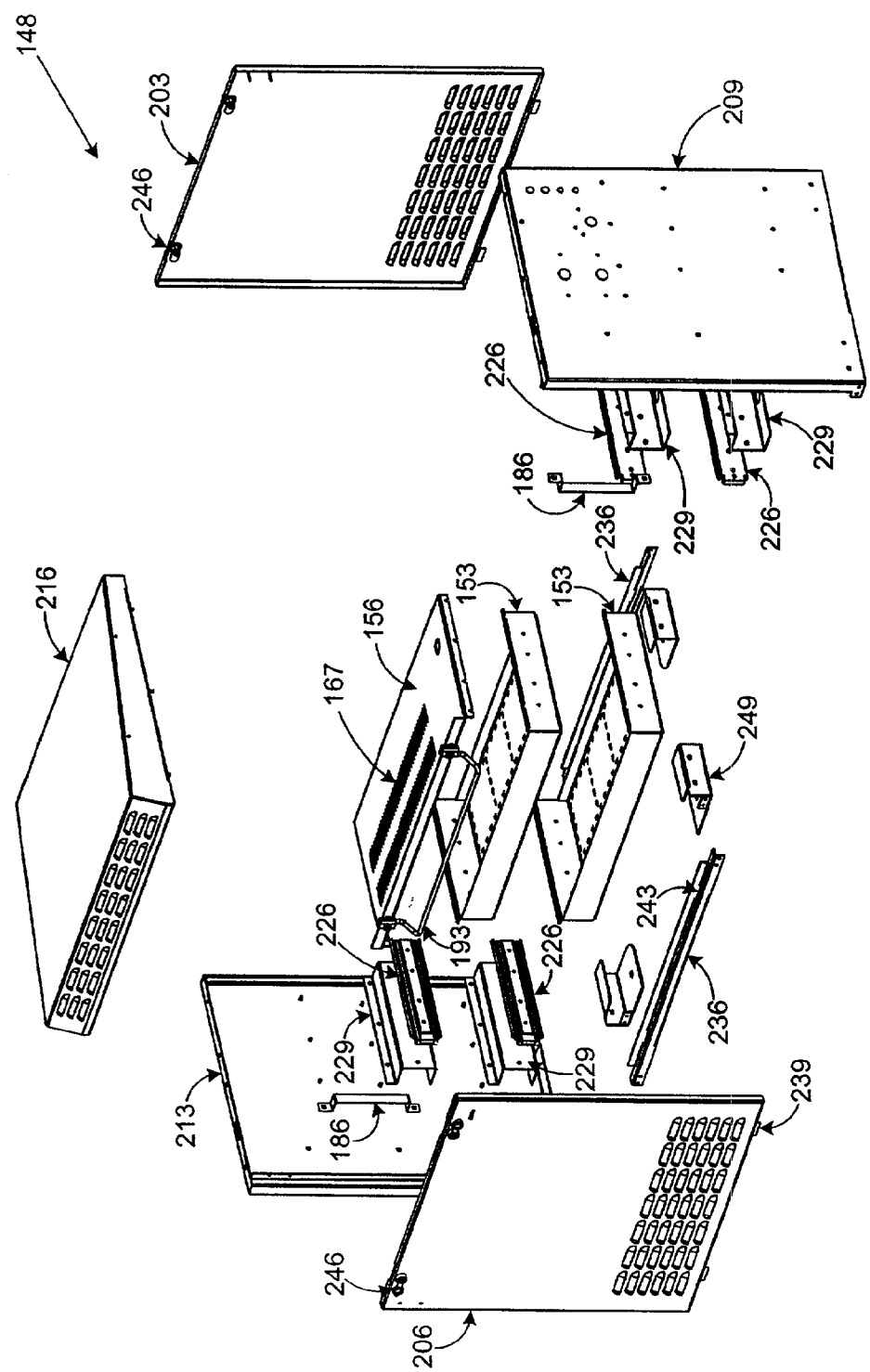
FIG. 26 is a rear exploded view of a cabinet of FIG. 22.

With reference to FIG. 26, shown is a second exploded view of the cabinet 148 that provides a second view of the components described with reference to FIG. 25.

Figure 27:
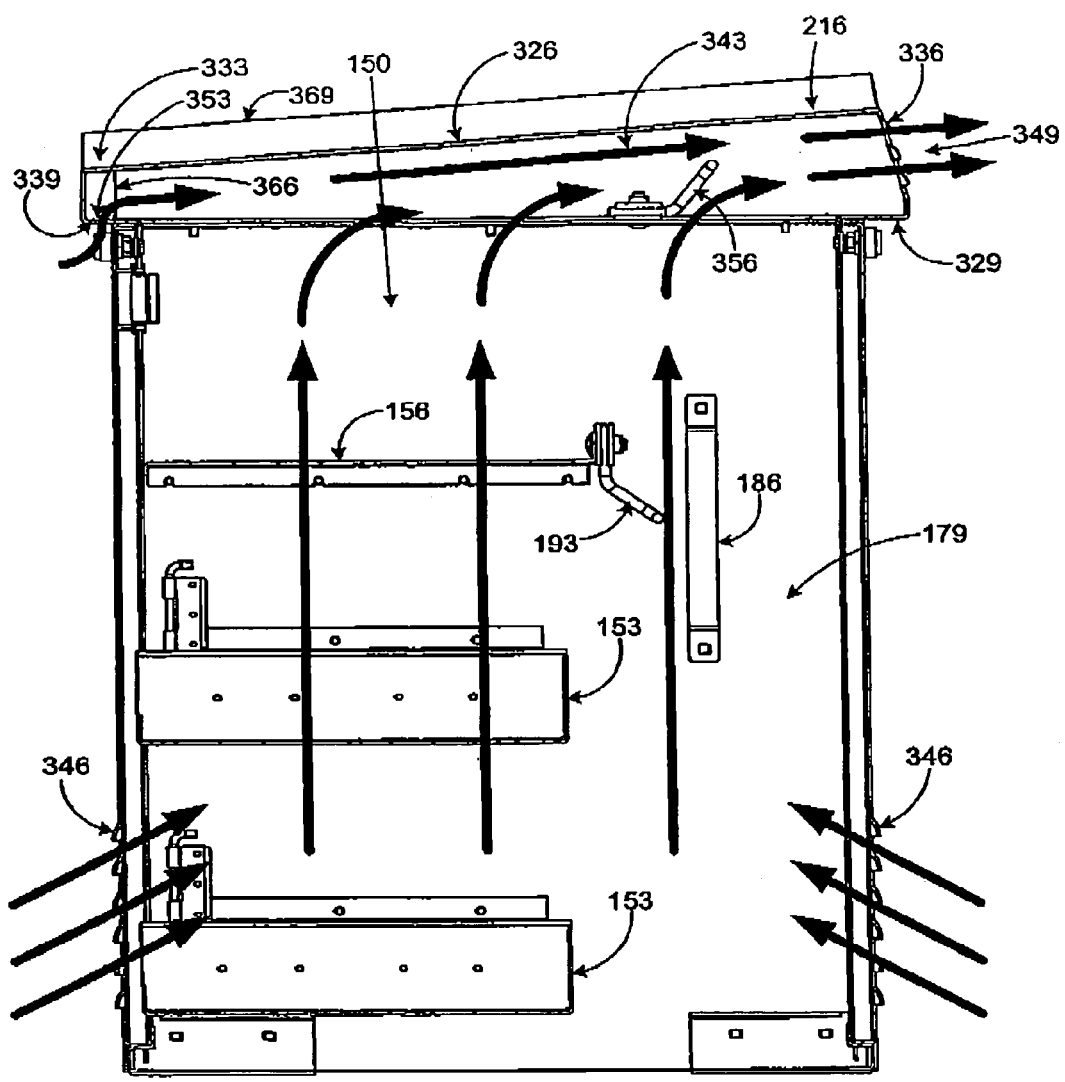
FIG. 27 is a side view of the cabinet of FIG. 22.

Turning then to FIG. 27, shown is a side view of the cabinet 148 according to an aspect of the present invention. The cabinet defines a chamber 150 with the battery storage drawers 153, the top shelf 156, and a cable storage compartment 179. The top cap 216 includes a canted ceiling 326 with a wide end that defines a first overhang portion 329 of the top cap 216. The top cap 216 also has a narrow end that defines a second overhang portion 333. A number of first air flow openings 336 are disposed in the first overhang portion of the top cap 216. Also, a number of second air flow openings 339 are disposed in the second overhang portion of the top cap 216. The air flow openings 336 and 339 are positioned so that the elevation of at least one of the first air flow openings 336 is greater than or equal to the elevation of the second air flow openings 339.

This results in an upward air flow 343 from the second overhang portion 333 to the first overhang portion 329 of the top cap 216 along the canted ceiling 326. Specifically, heat that rises within the cabinet 148 aids in the movement of the air flow 343 along the canted ceiling 326 and out the first air flow openings 336. Air that enters the cabinet 148 through the second air flow openings 339 also aids in the flow toward the first air flow openings 336. The air that enters the cabinet 148 through the second air flow openings 339 is from the environment surrounding the cabinet 148. In this regard, the air entering the air flow openings 339 may be cooler than the air within the cabinet 149. In this regard, heat that is generated by sunlight that falls upon the top cap 216 is moved out of the first air flow openings 336.

In addition, the air flow openings 163 (FIG. 24) in the battery storage trays 153 and the air flow openings 167 of the top shelf 156 aid in the upward migration of hot air toward the top cap 216 and eventually out the air flow openings 336. In addition, air flow openings 346 are provided in the front and rear side walls 203 and 206 to allow cool air to enter near the bottom of the cabinet 148 thereby increasing the upward air flow.

The first overhang portion 329 of the top cap 216 includes a first face 349 in which the air flow openings 329 are disposed. The air flow openings 329 may be, for example, louvers that provide for air flow while ensuring that rainfall and other water that comes into contact with the cabinet 148 remains outside of the cabinet 148. In addition, the second overhang portion 333 of the top cap 216 includes a second face 353 in which the air flow openings 339 are disposed. The air flow openings 339 may be, for example, a number of slots or other such openings.

The air flow that is established by the various air flow openings in the configuration described above provides for a reduction in the operating temperature of the cabinet 148. Specifically, heat that is generated from components within the cabinet 148 such as the uninterruptible power supply 176 (FIG. 23) helps generate the air flow that transfers the heat to the environment surrounding the cabinet 148. In this manner, the components within the cabinet can operate in a lower temperature environment and still be protected from the elements in the surrounding environment such as rain, wind, sleet, snow, etc. Also shown is an upper bracket 356 and the lower bracket 193. The lower bracket 193 is employed to hold the node 191 (FIG. 24) and the upper bracket 356 is employed to hold the cable splice enclosure 189 (FIG. 24).

As shown in FIG. 27, the elevation of the first overhang portion 329 is the same as the elevation of the second overhang portion 333. Specifically, the bottom of the first overhang portion 329 is in the same plane as the bottom of the second overhang portion 333. However, the elevation of the first and second overhang portions 329 and 333 may be offset with respect to each other. For example, the elevation of the first overhang portion 329 may be greater than the elevation of the second overhang portion 333 to enhance the upward air flow 343. As such, the bottom of the first overhang portion 329 may be positioned at an elevation that is greater than the second overhang portion 333 as is seen in the cabinet 10 shown with reference to FIG. 2.

In addition, although the top cap 216 is shown with both the first and second overhang portions 329 and 333, the cabinet 200 may also be constructed without the second overhang portion 329. Specifically, a back vertical face 366 may be substituted therefor. In such case, a number of air flow openings (not shown) may be disposed on the back vertical face 366 of the top cap 216 that would exist in the absence of the second overhang portion 333. Specifically, such air flow openings may be louvers that would prevent outside elements such rain or snow, etc. from entering the cabinet. Alternatively, top cap 216 may be constructed without the second overhang portion 333 and without air flow openings on the back vertical face 366, thereby eliminating any air flow into the cabinet 200 from that portion of the top cap 216. Such a configuration may diminish the air flow 343, however, for some electrical component storage applications, the resulting diminished air flow 343 may still provide adequate temperature control.

Also, the cabinet 200 may include a false surface member 369 that is exposed to an environment surrounding the cabinet 200. The false surface member 369 may be mounted over the top cap 216 that acts as a heat shield to reduce the heating effect of radiant heat such as sunlight that falls onto the cabinet 200.

Figure 28:
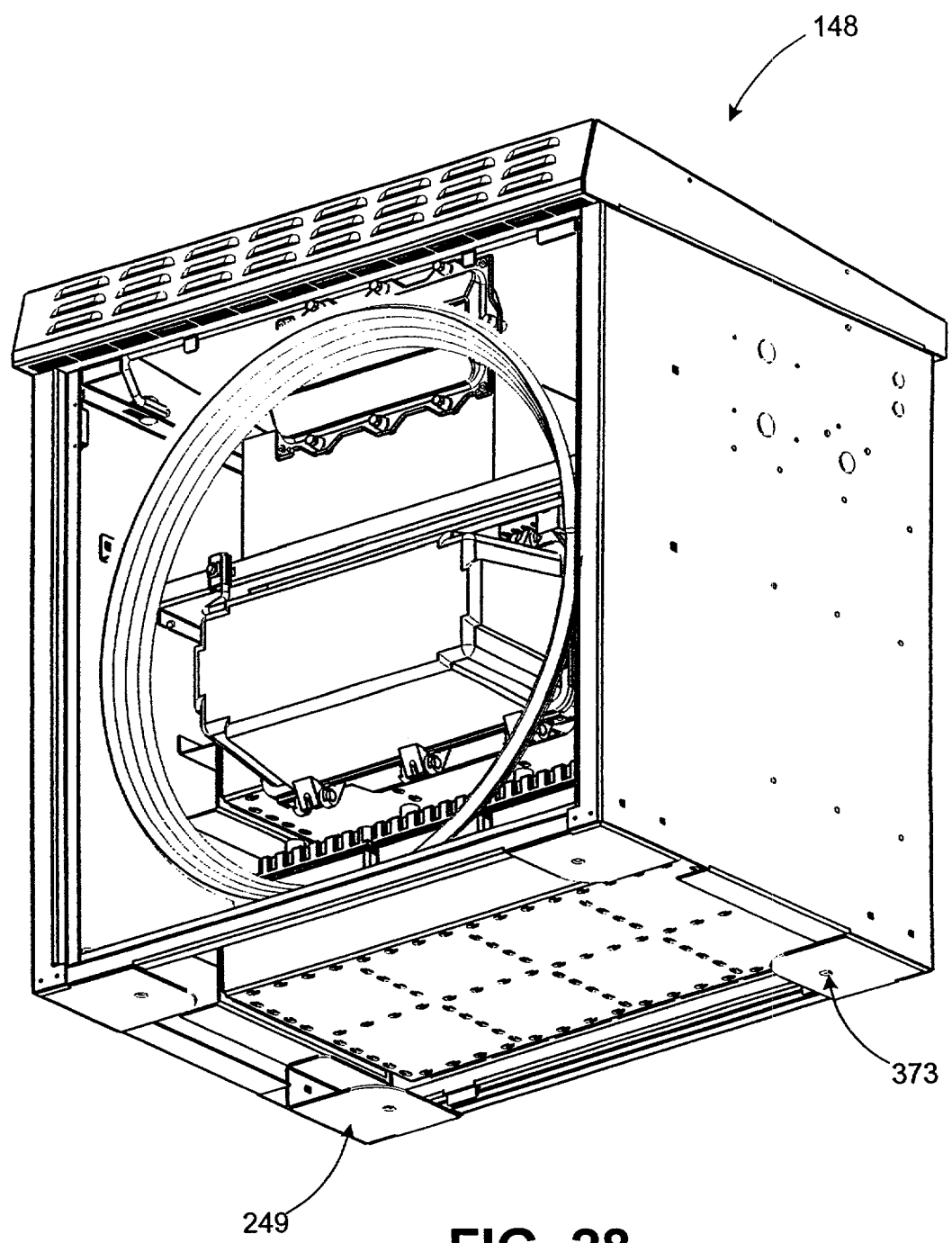
FIG. 28 is an upward rear perspective view of the cabinet of FIG. 22.

Turning to FIG. 28, shown is a perspective view of the cabinet 148 with the rear side wall 206 (FIG. 25) removed and also showing the underside of the cabinet 148. The underside of the cabinet 148 includes the feet 249 by which the cabinet 148 may be attached or otherwise moored to a flat surface that serves as a base. For example, the cabinet 148 may be mounted onto a block of cement or other surface area. In order to moor the cabinet 148 to such a surface, each of the feet 249 includes a hole 373 through which a bolt may be disposed to mount the cabinet 148 permanently onto the particular surface in question. Alternatively, the cabinet 148 may be mounted on the ground mount base 14 (FIG. 4), or the plate 101 (FIG. 14) may be attached to the feet 249 in the case that the cabinet 148 is mounted on a pole or otherwise installed off of the ground. The plate 101 includes various air flow openings that further enhance the air flow throughout the cabinet 148.

Figure 29:
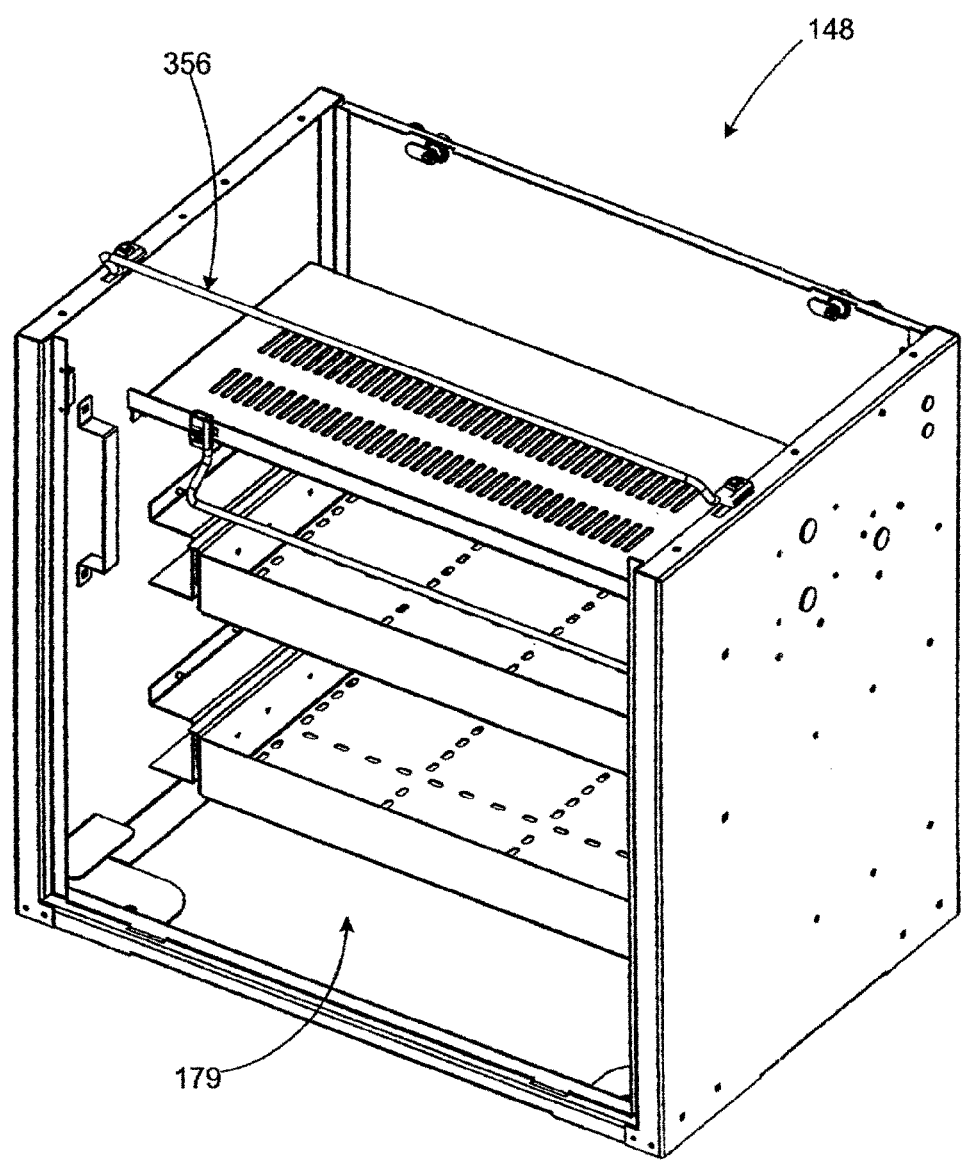
FIG. 29 is a frontal perspective view of the cabinet of FIG. 22 with the top cap and front panel removed.

With reference to FIG. 29, shown is a perspective view of the cabinet 148 with the top cap 216 (FIG. 25) and the rear side wall 206 removed so as to provide a further view of the upper bracket 356.

Although the invention is shown and described with respect to certain preferred embodiments, it is obvious that equivalents and modifications will occur to others skilled in the art upon the reading and understanding of the specification. The present invention includes all such equivalents and modifications, and is limited only by the scope of the claims.

What is claimed is:

1. A cabinet, comprising:
a chamber including a number of side walls and a top cap;
a canted ceiling formed by the top cap;
a first overhang portion defined by a wide end of the top cap;
a number of first air flow openings in the first overhang portion;
a second overhang portion defined by a narrow end of the top cap;
a number of second air flow openings in the second overhang portion, wherein an elevation of at least one of the first air flow openings is at least as great as an elevation of the second air flow openings;
a first face defined by the first overhang portion;
a second face defined by the first overhang portion; and
the first air flow openings including a number of louvers in the first face and a number of slots in the second face.

2. The cabinet of claim 1, further comprising a bottom plate attached to the side walls, the bottom plate having a number of third air flow openings.

3. The cabinet of claim 2, wherein the third air flow openings further comprise a number of slots in the bottom plate.

4. The cabinet of claim 1, further comprising a base attached to the side walls, the base having a number of third air flow openings.

5. The cabinet of claim 1, further comprising:
at least one battery storage drawer, the battery storage drawer including an area for storage of at least one battery;
a number of third air flow openings in the area, wherein the third air flow openings allow a convection air flow through the at least one battery storage drawer.

6. The cabinet of claim 5, wherein the third air flow openings are positioned to define at least one battery position in the area.

7. The cabinet of claim 5, wherein the third air flow openings are positioned to define a number of battery positions in the area.

8. The cabinet of claim 7, wherein the battery positions define a number of battery storage configurations.

9. The cabinet of claim 5, further comprising a cable storage compartment in the chamber having at least one cable retainer, wherein the cable retainer is adapted to hold an excess amount of a cable.

10. The cabinet of claim 1, further comprising a cable storage compartment in the chamber having at least one cable retainer, wherein the cable retainer is adapted to hold an excess amount of a cable.

11. The cabinet of claim 1, wherein the top cap includes a false top surface that is exposed to an environment surrounding the cabinet.

12. The cabinet of claim 1, wherein the elevation of the first overhang portion is offset with respect to the elevation of the second overhang portion.

13. The cabinet of claim 1, further comprising:
an area defined by a surface of the battery storage drawer for placement of at least one battery thereon; and
a number of air flow openings in the area through the surface, wherein the air flow openings allow a convection air flow through the battery storage drawer.

14. The cabinet of claim 13, wherein the air flow openings are positioned in the surface of the battery storage drawer to define at least one battery position in the area.

15. The cabinet of claim 14, wherein the air flow openings are positioned to define a number of battery positions in the area.

16. The cabinet of claim 15, wherein the arrangement of air flow openings in the surface of the battery storage drawer define battery positions to provide for a number of battery storage configurations.

17. The cabinet of claim 13, wherein the air flow openings are positioned in the surface of the battery storage drawer to define at least one battery position in the area to provide air flow alongside a battery positioned on the surface at the area.

18. A cabinet, comprising:
a chamber including a number of side walls and a top cap;
a canted ceiling formed by the top cap;
a first overhang portion defined by a wide end of the top cap;
a number of first air flow openings in the first overhang portion;
a second overhang portion defined by a narrow end of the top cap;
a number of second air flow openings in the second overhang portion, wherein an elevation of at least one of the first air flow openings is at least as great as an elevation of the second air flow openings;
at least one battery storage drawer, the battery storage drawer including an area for storage of at least one battery;
a number of third air flow openings in the area, wherein the third air flow openings allow a convection air flow through the at least one battery storage drawer;
a first bracket to hold a cable splice enclosure; and
a second bracket to hold a node.

19. A cabinet, comprising:
a chamber including a number of side walls and a top cap;
a canted ceiling formed by the top cap;
a first overhang portion defined by a wide end of the top cap;
a number of first air flow openings in the first overhang portion;
a second overhang portion defined by a narrow end of the top cap;
a number of second air flow openings in the second overhang portion wherein an elevation of at least one of the first air flow openings is at least as great as an elevation of the second air flow openings;
a cable storage compartment in the chamber having at least one cable retainer, wherein the cable retainer is adapted to hold an excess amount of a cable;
a first bracket to hold a cable splice enclosure; and
a second bracket to hold a node.

* * * * *